United States Patent [19]

Higashiyama

[11] Patent Number: 5,543,998
[45] Date of Patent: Aug. 6, 1996

[54] TEMPERATURE PROTECTED POWER TRANSISTOR CIRCUIT

[75] Inventor: Katsuhiko Higashiyama, Neyagawa, Japan

[73] Assignee: Matsushita Electric Industrial Co. Ltd, Kadoma, Japan

[21] Appl. No.: 249,256

[22] Filed: May 25, 1994

[30] Foreign Application Priority Data

May 28, 1993 [JP] Japan ..................................... 5-126895

[51] Int. Cl.⁶ ..................................................... H02H 5/04
[52] U.S. Cl. .............................................. 361/103; 361/88
[58] Field of Search .................................. 361/88, 89, 93, 361/94, 97–101, 103

[56] References Cited

U.S. PATENT DOCUMENTS 4,157,513  6/1979  Ghiringhelli et al. ..................... 361/97
4,553,048  11/1985  Bynum et al. ........................... 361/103
5,355,123  10/1994  Nishiura et al. .......................... 361/103

FOREIGN PATENT DOCUMENTS 5235654  9/1993  Japan .

OTHER PUBLICATIONS

An English language abstract of Japanese Patent Laid-open Unexamined Publication No. 5–235654. Sep. 1993.
"Technical Information, Class H+ Power Amplifiers", Technics, distributed in Osaka, Japan on Mar. 9, 1994.

Primary Examiner—Jeffrey A. Gaffin
Assistant Examiner—Ronald W. Leja
Attorney, Agent, or Firm—Greenblum & Bernstein P.L.C.

[57] ABSTRACT

A temperature protected power transistor circuit for preventing thermal breakdown of a power transistor is disclosed. The temperature protected power transistor circuit has a silicon power transistor of which the base area and emitter area are formed in a double diffusion process, and a temperature detection transistor having a specific area and formed in the same silicon chip as the silicon power transistor with the base-emitter area of the temperature detection transistor 3 electrically insulated from the silicon power transistor. The base terminal and emitter terminal of the temperature detection transistor are connected to a discrete IC 12. A base-emitter voltage detector detecting that the base-emitter voltage has reached a predetermined voltage, and a bias resistor for adjusting the base-emitter voltage offset are also provided.

17 Claims, 5 Drawing Sheets

TEMPERATURE PROTECTED POWER TRANSISTOR CIRCUIT

BACKGROUND OF THE INVENTION

1. Field of the Invention

The present invention relates to a temperature protected power transistor circuit for detecting in a short time the temperature of a silicon power transistor of which the base area and emitter area are formed by a double diffusion process.

2. Description of the Prior Art

Temperature protected power transistor circuits are used in a variety of forms to provide an essential protection function for power transistors used in the power control field.

An example of a conventional power transistor temperature protection circuit of this type is described below with reference to the figures.

The basic structure of a conventional temperature protected power transistor circuit is shown in FIG. 4. The base area and emitter area of the silicon power transistor chip 1 are formed by a double diffusion process. The silicon power transistor chip 1 comprises a copper heat sink 6 connected to the collector terminal, a power transistor base terminal 7, and a power transistor emitter terminal 8.

The integrated circuit (IC) 12 is another silicon chip formed discretely from the silicon power transistor chip 1. The IC 12 comprises a voltage source 5, constant current source 18, temperature detection output transistor 20, an output terminal pull-up resistor 21, power supply terminal 25, output terminal 26, ground terminal 24, resistors 27 and 28 for setting the detection temperature, and a temperature detection transistor 29. The silicon transistor chip 1 and the IC 12 are mounted on a common board 30.

FIG. 5 is a plan view showing how a hybrid integrated circuit device using the temperature protected power transistor circuit device shown in FIG. 4 is mounted; like parts are indicated by like reference numerals in FIGS. 4 and 5. The collector terminal 6 is made of copper, the components of this system are mounted on a hybrid integrated circuit mounting board 30, and the IC 12 is connected to the mounting board 30 using bonding wires 31.

The structure of the temperature protected power transistor circuit thus comprised is described below.

It should first be noted that the silicon power transistor 1 formed on the hybrid integrated circuit mounting board 30 is used in some power control circuit, such as a power amplifier. The collector loss of the silicon power transistor 1 occurring during normal operation is presented in a form of heat which is dissipated from the copper collector terminal 6. When this heat is conducted through the hybrid integrated circuit mounting board 30 to the IC 12 formed from a discrete silicon chip and the temperature detection transistor 29 reaches a predetermined temperature level, the temperature detection output terminal 26 changes from an OFF to an ON (LOW→HIGH) state. In general, the allowable collector loss of the silicon power transistor 1 is limited, and thermal breakdown occurs when heat generation exceeds this allowable limit.

FIG. 6 is a cross section of a transistor wherein the base area and emitter area are formed by a double diffusion process. Shown in FIG. 6 are the emitter area 32, base area 33, collector high resistivity area 34, collector high impurities concentration area 35, and collector back 36. In a bipolar transistor in which the base area and emitter area are formed by a double diffusion process as shown in FIG. 6, there is no diffusion process that completely isolates the individual elements electrically. In particular, because the collector electrode is provided as a common electrode, it is impossible to form functional circuits combining plural active elements or passive elements, and it is impossible to form a temperature protection circuit on the power transistor chip.

As a result, temperature protected power transistor circuits are generally formed on a separate board from the power transistor chip.

However, a temperature gradient develops due to the heat transmission delay time and the heat resistance of the silicon power transistor 1 in the conventional temperature protected power transistor circuit described above because the temperature detection transistor 29 is formed in the IC 12 of a separate silicon chip. As a result, it is not possible to detect sudden temperature peaks in the silicon chip 1 within extremely short periods (e.g., several ten to several hundred milliseconds).

SUMMARY OF THE INVENTION

Therefore, an object of the present invention is to provide a temperature protected power transistor circuit for detecting the chip temperature of a silicon power transistor within an extremely short period of time when the silicon power transistor emits abnormal heat levels.

To achieve this object, a temperature protected power transistor circuit according to the present invention comprises a silicon power transistor of which the base area and emitter area are formed in a double diffusion process, and a temperature detection transistor comprising a base area and emitter area electrically insulated from the silicon power transistor and formed with a specific area in the silicon of the silicon power transistor. This temperature protected power transistor circuit is characterized by being able to detect the chip temperature of the silicon power transistor in a short time by connecting the base terminal of the temperature detection transistor to a base-emitter voltage detector. The base-emitter voltage detector is capable of detecting that the base-emitter voltage has reached a predetermined voltage level and formed as a separate body to the silicon of the silicon power transistor on the mounting board, and connecting the emitter terminal of the temperature detection transistor to a bias resistor for adjusting the offset voltage of the base-emitter voltage.

By this structure, the invention detects if the chip temperature of the silicon power transistor has reached a predetermined temperature by detecting the change in the base-emitter voltage of the temperature detection transistor formed on the same silicon body as the silicon power transistor. Because the temperature detection transistor is formed on the same silicon chip as the silicon power transistor, detection is possible in an extremely short period of time, the detection temperature setting can be freely adjusted by externally adjusting the offset voltage, and chip temperature detection with an extremely high degree of freedom can be achieved.

BRIEF DESCRIPTION OF THE DRAWINGS

The present invention will become more fully understood from the detailed description given below and the accompanying diagrams wherein.

DESCRIPTION OF PREFERRED EMBODIMENTS

The first embodiment of a temperature protected power transistor circuit according to the present invention is described in detail below with reference to FIGS. 1 and 2.

Figure 1:
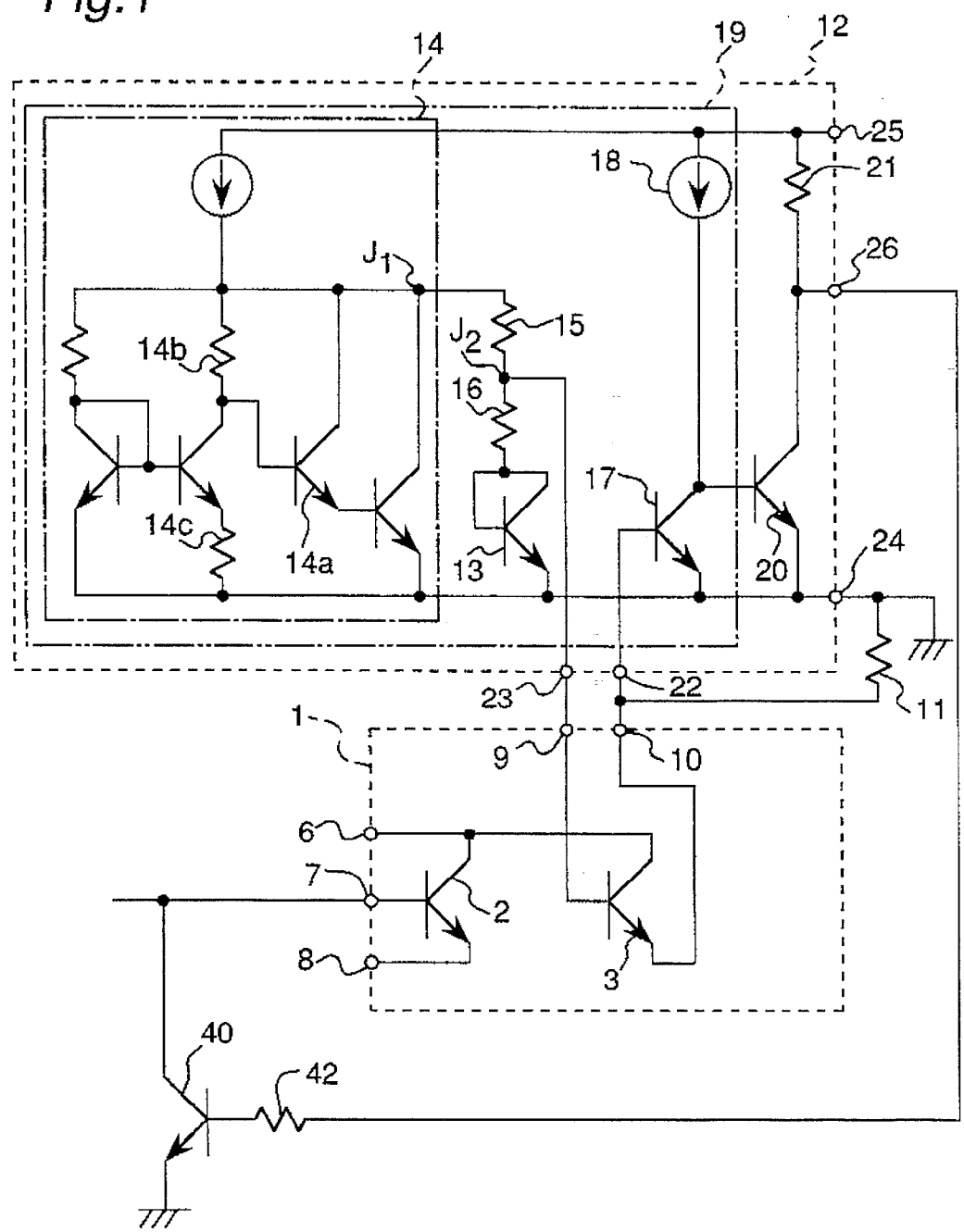
FIG. 1 is a circuit diagram of a temperature protected power transistor circuit according to the first embodiment of the present invention.

Referring to FIG. 1 a temperature protected power transistor circuit according to the first embodiment of the invention is shown which has an NPN silicon chip 1 formed by a double diffusion process, and an IC 12 formed by an IC forming process in a separate silicon chip from the NPN silicon chip 1.

The NPN silicon chip 1 is a discrete chip and has a power transistor 2 which operates at a high power such as a power greater than 1 watt collector loss, and a temperature detection transistor 3 which is located closely adjacent the power transistor 2 and produces a base-emitter voltage which changes proportionally to the temperature change of the transistor 2. The base area and emitter area of the NPN silicon chip 1 are formed by a double diffusion process. The power transistor 2 has a collector terminal 6, a base terminal 7 and an emitter terminal 8. The temperature detection transistor 3 has a base terminal 9, an emitter terminal 10 and a collector terminal 6, in which the collector terminal 6 is commonly used with the collector terminal 6 of the power transistor 6. The power transistor 2 may be formed by a group of transistors arranged, e.g., in a Darlington connection. The same can be said to other transistors, such as, to transistor 3. The NPN silicon chip 1 is available in market by a model No. M42BA15D-N or M42BA15D-P manufactured by Matsushita Electronics Corporation of Japan, and is disclosed in detail in U.S. patent application Ser. No. 08/119575 of Hideaki NAKURA et al., titled "Semiconductor Device" filed Sep. 13, 1993 (corresponding to Japanese Patent Application No. H05-82909 filed Apr. 9, 1993).

The IC 12 is formed in a separate silicon chip from the NPN silicon chip 1, and has a power receiving terminal 25 for receiving a predetermined voltage, a ground terminal 24 connected to ground and an output terminal 26. The IC 12 comprises a voltage source 14 which produces from its output J1 a voltage almost equal to a constant voltage (e.g. 1.9 volts), but slightly dependent on temperature change. Such a voltage source 14 is similar to a circuit known as a band gap reference circuit, but differs in the provision of transistor 14a. Thus, the circuit 14 is herein referred to as a quasi band gap reference circuit. The output at junction J1, which is the output of the quasi band gap reference circuit, is connected through resistors 15 and 16 to a compensation transistor 13. The transistor 13 has its base and collector connected together so that the transistor 13 serves as a diode. Thus, a junction J2 between resistors 15 and 16 produces nearly a constant voltage. The circuit defined by a block 19 defines a base-emitter voltage detector for detecting the base-emitter voltage of the transistor 3. Output terminal 26 is connected through a resistor 42 to a base of transistor 40. The collector of transistor 40 is connected to the base of power transistor 2 through terminal 7.

A constant current source 18 and a transistor 17 are connected between terminals 25 and 24, and also a pull-up resistor 21 and a transistor 20 are connected between the same. The base of the transistor 17 is connected to a terminal 22 and the junction J2 is connected to terminal 23. An externally provided resistor 11 is connected between terminals 22 and 24 for adjusting the offset voltage. Terminals 22 and 10 are connected together, and terminals 23 and 9 are connected together. Thus, the base-emitter voltage of the temperature detection transistor 3 appears between terminals 23 and 22, i.e., between the junction J2 and the base of transistor 17.

Transistors 13 and 17 are located closely adjacent to each other in the IC chip and have identical characteristics so that the transistors 13 and 17 behave in the same manner with respect to temperature change. Thus, with respect to the temperature change, the voltage variation at the base of transistor 13 will be exactly the same as the voltage variation at the base of transistor 17, if both transistors 13 and 17 are supplied with the same voltage. It is noted that the term "voltage variation" used herein is to mean a voltage variation caused solely by temperature change and can be expressed by a $\Delta V/\Delta T$ in which V is voltage and T is temperature. In this case, the voltage variation at junction J2 will not be exactly the same as the voltage variation at the at base of transistor 17. To have a voltage variation at junction J2 exactly the same as that at the base of transistor 17, the voltage at junction J1 should be slightly varied with respect to temperature. For this purpose, transistor 14a is inserted in the so-called band gap reference circuit. Resistors 14b and 14c serve as adjusting elements. Thus, by the voltage source 14, the voltage variation at junction J2 and that at the base of transistor 17 are made exactly the same. Thus, if the circuit is open between terminals 22 and 23, the voltage difference between terminals 22 and 23 is constant regardless of the temperature change. As apparent from the above, transistor 13 compensates the voltage variation in transistor 17.

Since transistor 3 is connected between junction J2 and the base of transistor 17, base of transistor 17 receives a sum voltage of a voltage, $\{V(J2)+T \cdot \Delta V/\Delta T\}$, at junction J2 plus the voltage, $-Vbe(3)$, across transistor 3, which varies relatively to temperature. In other words, the voltage Vb(17) at the base of transistor 17 can be expressed as $$Vb(17)=\{V(J2)+T \cdot \Delta V/\Delta T\}-Vbe(3). \tag{1}$$

Transistor 17 is an ON-OFF transistor switched at a predetermined threshold voltage Vth, $$Vth=Vto+T \cdot \Delta V/\Delta T, \tag{2}$$

which is also temperature dependent. In other words, transistor 17 is switched ON when $$Vb(17)>Vth. \tag{3}$$

This can be expressed as:

$$\{V(J2)+T\cdot \Delta V/\Delta T\}-Vbe(3) > Vto+T\cdot \Delta V/\Delta T \quad (4)$$

thus $$Vbe(3) < V(J2)-Vto. \quad (5)$$

In other words, transistor 17 switches only with respect to the voltage Vbe(3) of transistor 3 and receives no influence by the temperature change. More specifically, transistor 17 switches ON when the voltage Vbe(3) becomes smaller than a predetermined voltage, V(J2)–Vto.

Figure 2:
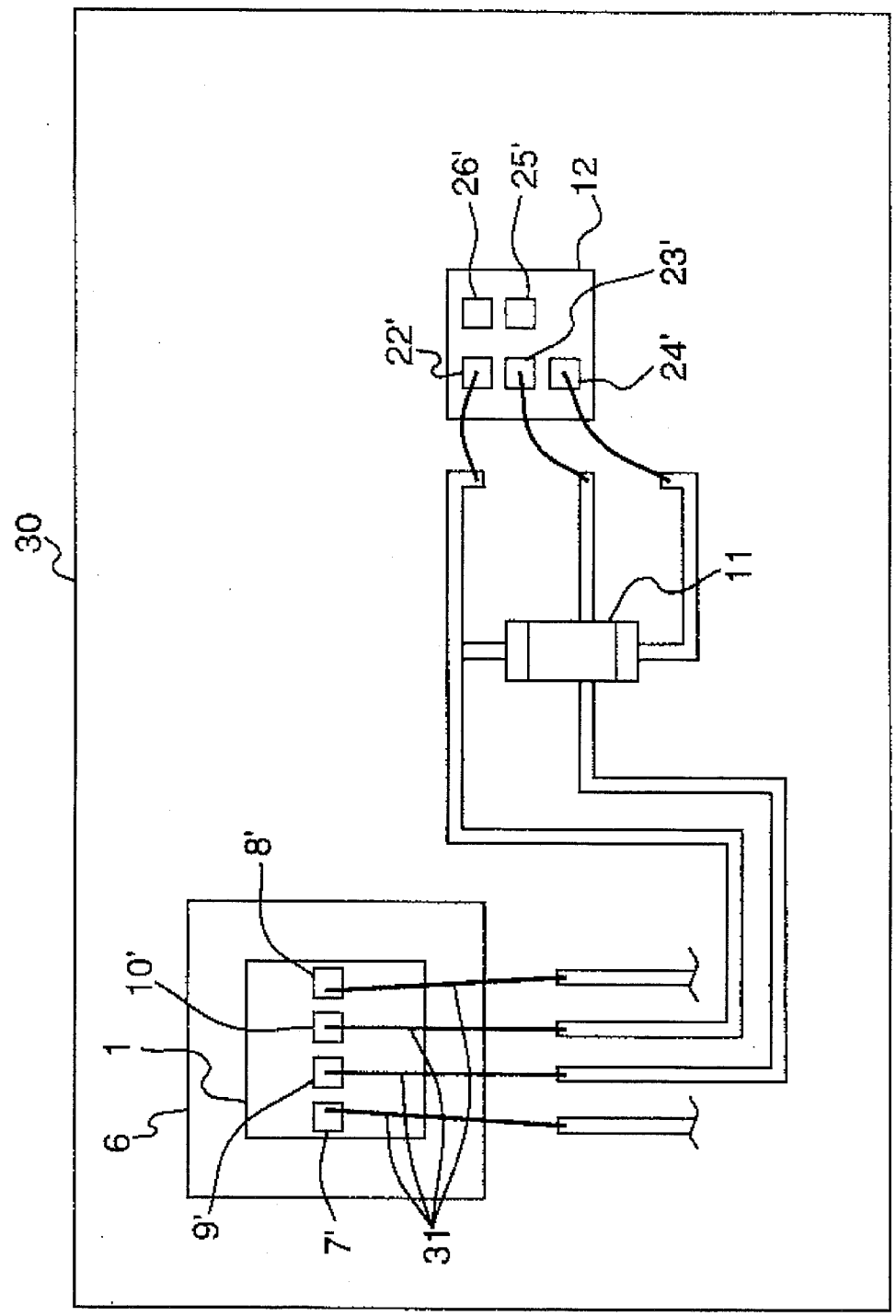
FIG. 2 is a plan view of a hybrid integrated circuit mounting board using a temperature protected power transistor circuit of FIG. 1.

Referring to FIG. 2, a plan view of the temperature protected power transistor unit is shown. The temperature protected power transistor unit has a hybrid integrated circuit mounting board 30 on which NPN silicon chip 1, IC 12, resistor 11, and suitable electrodes are mounted, to present the circuit of FIG. 1. The NPN silicon chip 1 has bonding pads 7', 8', 9', and 10' corresponding to the terminals 7, 8, 9 and 10, respectively. A copper sheet 6', corresponding to terminal 6, is provided on the bottom surface of the chip 1 facing the board 30. Bonding wires 31 are used to connect the terminals 7–10 to electrodes. Similarly, IC 12 has bonding pads 22', 23', 24', 25' and 26' corresponding to the terminals 22, 23, 24, 25 and 26, respectively.

A temperature protected power transistor circuit thus comprised operates as described below.

It should first be noted that the power transistor 2 formed on the hybrid integrated circuit mounting board 30 is used in some power control circuit, such as a power amplifier (not shown). The temperature protected power transistor according to the present invention can be applied to any circuit that uses a power transistor. The collector loss of power transistor 2 occurring during normal operation is presented in a form of heat from the silicon chip 1 through the copper collector terminal 6 and dissipated. This heat is also transmitted to the temperature detection transistor 3 formed on the same silicon chip. The time required for heat transmission is generally within several ten milliseconds.

The base-emitter voltage Vbe(3) of the temperature detection transistor 3 varies almost linearly with respect to temperature (approximately –2 mV to –2.5 mV/°C.) of transistor 3, and thus functions as a good temperature sensor, detecting changes in the temperature of the transmitted heat. As the temperature of transistor 3 increases, the base-emitter voltage Vbe(3) of the temperature detection transistor 3 becomes small. When the base-emitter voltage Vbe(3) becomes smaller than a predetermined voltage given by the above formula (5), transistor 17 turns on. Thus, transistor 20 turns off to produce a HIGH level signal from terminal 26. Thus, transistor 40 turns on to forcibly connecting the base of the power transistor to ground to turning off the power transistor 2. Thus, the overheat of the power transistor 2 can be prevented.

After a while, when the temperature of the power transistor 2 becomes low, the base-emitter voltage Vbe(3) of the temperature detection transistor 3 becomes greater than the predetermined voltage. Thus, transistor 17 turns off. And, in turn, transistor 20 turns on to produce a LOW level signal from terminal 26. Thus, transistor 40 turns off to operate the power transistor 2 according to the signal applied to its base from a driving circuit (not shown).

Figure 3:
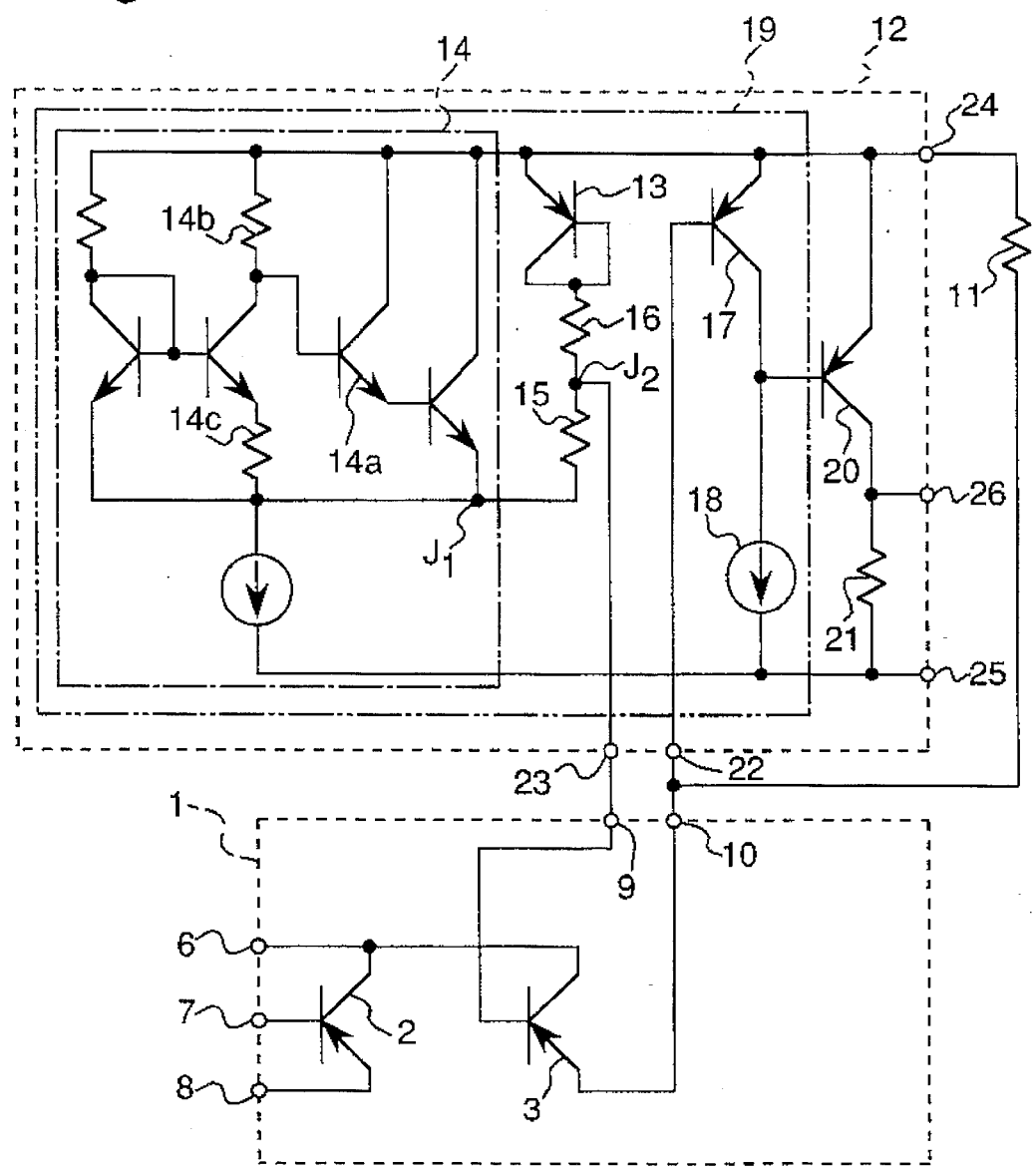
FIG. 3 is a circuit diagram of a temperature protected power transistor circuit according to the second embodiment of the present invention.
Figure 4:
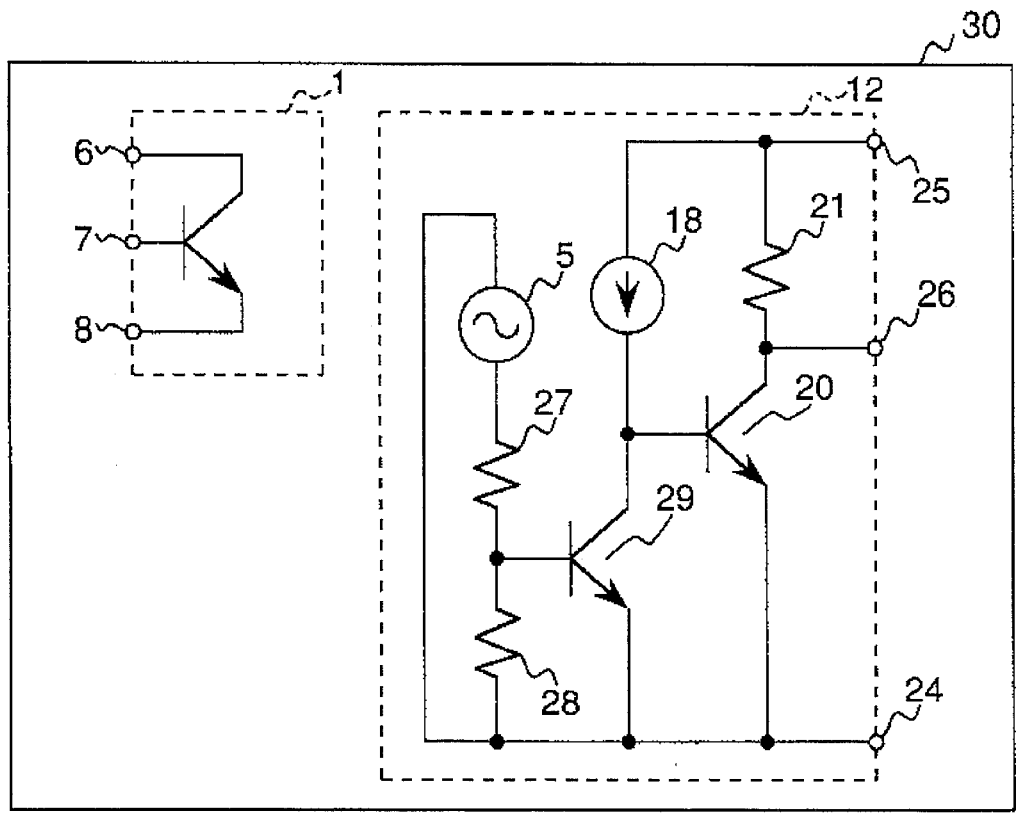
FIG. 4 is a circuit diagram of a conventional temperature protected power transistor circuit.
Figure 5:
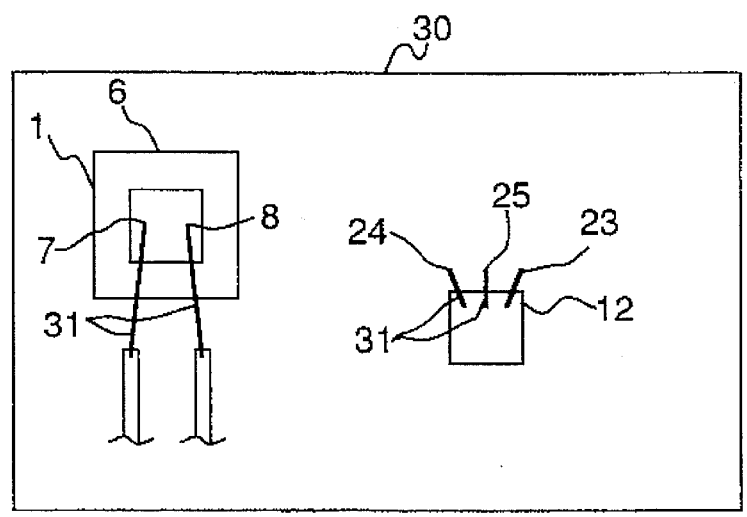
FIG. 5 is a plan view of a hybrid integrated circuit mounting board using a conventional temperature protected power transistor circuit of FIG. 4.
Figure 6:
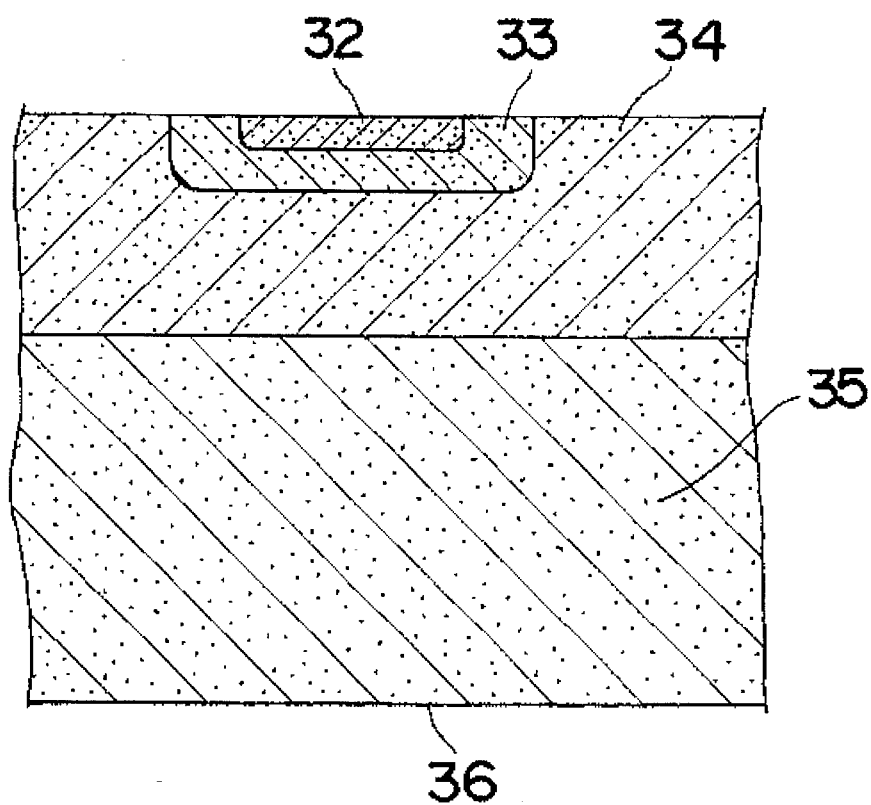
FIG. 6 is a cross-sectional view of a silicon chip of which the base area and emitter area are formed by a double diffusion process applicable to the present invention.

Referring to FIG. 3, a temperature protected power transistor circuit according to the second embodiment of the invention is shown. A PNP silicon chip 1 with the base area and emitter area are formed by a double diffusion process.

The PNP silicon chip has a PNP power transistor 2, temperature detection transistor 3, collector terminal 6, PNP power transistor base terminal 7, PNP power transistor emitter terminal 8, temperature detection transistor base terminal 9, and temperature detection transistor emitter terminal 10. External to the PNP silicon chip 1 and IC 12 is a bias resistor 11 for adjusting the offset voltage.

The IC 12 is formed in a separate silicon chip from the PNP silicon chip 1, and comprises a transistor 13 connected in a form of a diode, and transistor 17 for detecting the base-emitter voltage of the temperature detection transistor 3. The IC 12 further comprising a voltage source 14, resistors 15 and 16 for setting the detection temperature, a constant current source 18, base-emitter voltage detector 19, temperature detection output transistor 20, output terminal pull-up resistor 21, a first input terminal 22 connected to the emitter terminal 10 of the temperature detection transistor 3, a second input terminal 23 connected to the base terminal 9 of the temperature detection transistor 3, a reference ground terminal 24, a power supply terminal 25, and an output terminal 26.

Because a PNP type silicon chip 1 is used in this embodiment, the same functionality provided by the NPN type silicon chip 1 can be achieved by reversing the polarities of all active elements and the power supply. Because the temperature sensor is still the base-emitter voltage of the temperature detection transistor 3, the same characteristics as the NPN type can be easily achieved without being affected by such characteristics as a lateral-PNP in the integrated circuit.

It is to be noted that the IC 12 is an integrated circuit component formed in a separate silicon chip from silicon chip 1, but it can also be a circuit device of discrete elements. In addition, the mounting board, 30 is described as a hybrid integrated circuit mounting board in these embodiments, but it can also be a common printed circuit board. In addition, the silicon chip 1 is described as being an NPN or PNP type silicon chip with the base area and emitter area formed by a double diffusion process and mounted on a hybrid integrated circuit mounting board, but because it may be alternatively comprised of discrete NPN or PNP type devices, potential applications for the invention can be found throughout the field of power control devices.

Furthermore, the signal produced from output terminal 26 should not necessarily be connected to transistor 40 as shown in FIG. 1, but can be connected to a warning circuit (not shown) for producing visual or audio warning signal.

As will be known from the above descriptions of the preferred embodiments, because heat emissions from the silicon power transistor can be detected in a short time (several ten to several hundred milliseconds) by forming the temperature detection transistor on the same silicon chip as the silicon power transistor, a high performance temperature sensor can be provided for detecting abnormal heat emissions caused by overcurrent application before the critical temperature at which thermal breakdown of the silicon power transistor occurs, and chip breakdown can thus be prevented.

Also, because the silicon chip 1 for the power transistor 2 is provided separately from IC 12, IC 12 can be operated at voltage lower than that is required to operated the power transistor. Thus, IC 12 can be manufactured at a low cost when compared with a case when such a power transistor is installed inside the IC 12.

Also, because the voltage difference between terminals 22 and 23 in open circuit is maintained constant regardless of the temperature change, the base-emitter voltage Vbe(3) of transistor 3 can be detected with a high accuracy.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A temperature protected power transistor circuit comprising:
    a power transistor formed in a silicon chip;
    a temperature detection transistor formed in said silicon chip in a vicinity of said power transistor for receiving heat emitted from said power transistor and for producing a voltage drop signal proportional to a temperature of said power transistor;
    a voltage detector for detecting said voltage drop signal, said voltage detector comprising:
    a switching transistor for effecting on and off operations relative to a threshold voltage level which varies with respect to temperature;
    a quasi band gap reference circuit for producing a nearly constant voltage, wherein said nearly constant voltage varies slightly with respect to temperature;
    a voltage divider connected to said quasi band gap reference circuit, and having a terminal for producing a divided voltage;
    a compensation transistor connected to said voltage divider for compensating a threshold voltage level variation in said switching transistor caused by a temperature change, said voltage drop signal being detected between said terminal and said switching transistor, whereby said voltage detector produces a signal from said switching transistor when said voltage drop signal indicates that the heat emitted from said power transistor exceeds a predetermined threshold temperature.

2. A temperature protected power transistor circuit as claimed in claim 1, wherein said power transistor and said temperature detection transistor are formed in a single silicon chip, a base area and an emitter area of said silicon chip are formed by a double diffusion process.

3. A temperature protected power transistor circuit as claimed in claim 2, wherein said voltage detector is formed by an IC chip separately from said silicon chip.

4. A temperature protected power transistor circuit as claimed in claim 3, wherein said silicon chip and said IC chip are mounted on a common circuit board.

5. A temperature protected power transistor circuit as claimed in claim 1, further comprising an offset resistor connected to said switching transistor for controlling an offset voltage.

6. A temperature protected power transistor circuit comprising:
    a power transistor formed in a silicon chip;
    a temperature detection transistor formed in said silicon chip in a vicinity of said power transistor for receiving heat emitted from said power transistor and for producing a voltage drop signal proportional to a temperature of said power transistor;
    a voltage detector formed in an IC chip for detecting said voltage drop signal, said voltage detector comprising a quasi band gap reference circuit for producing a nearly constant voltage, wherein said nearly constant voltage varies slightly with respect to temperature;
    said silicon chip and said IC chip comprising separate chips.

7. The temperature protected power transistor circuit according to claim 6, said voltage drop signal defined by a change in a base-emitter voltage of said temperature detection transistor.

8. The temperature protected power transistor circuit according to claim 6, said quasi band gap reference circuit comprising a transistor for slightly varying a substantially constant voltage with respect to temperature.

9. The temperature protected power transistor circuit according to claim 6, further comprising a compensation transistor and a switching transistor, said compensation transistor coupled to an output of said quasi band gap reference circuit for compensating a voltage variation in said switching transistor.

10. The temperature protected power transistor circuit according to claim 9, said compensation transistor and said switching transistor having substantially identical characteristics with respect to temperature.

11. The temperature protected power transistor circuit according to claim 9, further comprising a voltage divider having an input coupled to said output of said quasi band gap reference circuit and an output coupled to said compensation transistor,
    wherein a voltage variation at said output of said voltage divider is the same as a voltage variation at a base of said switching transistor.

12. The temperature protected power transistor circuit according to claim 9, said switching transistor being actuated by an output of said temperature detecting transistor.

13. The temperature protected power transistor circuit according to claim 9, wherein when heat emitted from said power transistor exceeds a predetermined level, said switching transistor effects a cooling of said power transistor.

14. The temperature protected power transistor circuit according to claim 13, said cooling of said power transistor includes connecting a base of said power transistor to ground.

15. The temperature protected power transistor circuit according to claim 9, wherein when heat emitted from said power transistor exceeds a predetermined level, said switching transistor turns off said power transistor.

16. The temperature protected power transistor circuit according to claim 13, said power transistor being turned off via connection of a base of said power transistor to ground.

17. The temperature protected power transistor circuit according to claim 6, said voltage detector further comprising a switching transistor for effecting on and off operations relative to a threshold voltage level which varies with respect to temperature; and
    a voltage divider coupled to said quasi band gap reference circuit, and having a terminal for producing a divided voltage;
    a compensation transistor coupled to said voltage divider for compensating a threshold voltage level variation in said switching transistor caused by a temperature change, said voltage drop being detected between said terminal and said switching transistor, whereby said voltage detector produces a signal from said switching transistor when said voltage drop signal indicates that the heat emitted from said power transistor exceeds a predetermined threshold temperature.

* * * * *

UNITED STATES PATENT AND TRADEMARK OFFICE
CERTIFICATE OF CORRECTION

PATENT NO. : 5,543,998
DATED : August 6, 1996
INVENTOR(S) : Katsuhiko HIGASHIYAMA It is certified that error appears in the above-indentified patent and that said Letters Patent is hereby corrected as shown below:

On the cover, in section [73], "Assignee:", line 2, change "Kadoma" to ---Osaka---.

Signed and Sealed this

Twenty-fifth Day of March, 1997

Attest:

BRUCE LEHMAN

Attesting Officer

Commissioner of Patents and Trademarks